(12) United States Patent
Widerin

(10) Patent No.: US 7,546,102 B2
(45) Date of Patent: Jun. 9, 2009

(54) DUAL BAND FREQUENCY SYNTHESIZER

(75) Inventor: Peter Widerin, Hoerbranz (AT)

(73) Assignee: NewLogic Technologies GmbH, Lustenau (AT)

( * ) Notice: Subject to any disclaimer, the term of this patent is extended or adjusted under 35 U.S.C. 154(b) by 428 days.

(21) Appl. No.: 11/379,841

(22) Filed: Apr. 24, 2006

(65) Prior Publication Data
US 2006/0258299 A1 Nov. 16, 2006

(30) Foreign Application Priority Data
Apr. 28, 2005 (DE) .................. 10 2005 019 786

(51) Int. Cl.
*H04B 7/00* (2006.01)
(52) U.S. Cl. .................. 455/260; 455/316; 455/323; 331/60
(58) Field of Classification Search ......... 455/255–260, 455/302–304, 313–318, 323, 324; 331/60
See application file for complete search history.

(56) References Cited

U.S. PATENT DOCUMENTS

| 3,913,020 | A | * | 10/1975 | Van Anrooy | ............. | 455/180.3 |
| 5,761,615 | A | | 6/1998 | Jaffee | | |
| 6,085,075 | A | * | 7/2000 | Van Bezooijen | ............. | 455/260 |
| 6,282,413 | B1 | * | 8/2001 | Baltus | ............. | 455/260 |
| 6,782,249 | B1 | | 8/2004 | Feldman | | |
| 2002/0164961 | A1 | | 11/2002 | Atkinson et al. | | |
| 2003/0072389 | A1 | * | 4/2003 | Li et al. | ............. | 375/308 |
| 2004/0224644 | A1 | | 11/2004 | Wu et al. | | |

FOREIGN PATENT DOCUMENTS

| DE | 101 42 249 | 4/2003 |
| WO | WO03/026126 | 3/2003 |
| WO | 2005/078916 | 8/2005 |

OTHER PUBLICATIONS

Razavai, B., "A 900-MHz/1.8-GHz CMOS Transmitter for Dual-Band Applications", IEEE Journal of Solid-State Circuits, vol. 34, No. 5, May 1999.

* cited by examiner

*Primary Examiner*—Nhan T Le
(74) *Attorney, Agent, or Firm*—Baker & Daniels LLP

(57) ABSTRACT

The invention relates to a dual band frequency synthesizer for generating either a first output frequency $f_{high}$ or a second output frequency $f_{low}$, where $f_{high}=2\ f_{low}$, comprising an oscillator circuit for generating at its output a frequency $f_{VCO}=(f_{high}+f_{low})/2$, a divide by three (3) circuit, coupled to the output of the oscillator circuit, for generating at its output an offset frequency $f_{DB3}=f_{VCO}/3$, and a double quadrature mixer circuit, coupled to the output of the oscillator circuit and to the output of the divide by three circuit, for generating either the first output frequency $f_{high}=f_{VCO}+f_{DB3}$ or the second output the frequency $f_{low}=f_{VCO}-f_{DB3}$.

4 Claims, 1 Drawing Sheet

DUAL BAND FREQUENCY SYNTHESIZER

FIELD OF THE INVENTION

The present invention relates to a dual band frequency synthesizer, and in particular to a new frequency plan for a Dual Band PLL (Phase Locked Loop) oscillator where the two possible output frequencies $f_{high}$ and $f_{low}$ differ by a factor of two (2), i.e., $f_{high}=2\,f_{low}$.

DESCRIPTION OF THE RELATED ART

The concept of dual band transmitters using single side band mixers to add or subtract two frequencies has been presented in the literature: B. Razavi, "A 900-MHz/1.8-GHz CMOS Transmitter for Dual-Band-Application", IEEE Journal of Solid-State Circuits, Vol. 34, No. 5, May 1999, pp.573-579. Razavi uses two (2) PLLs: One PLL operating frequency is placed just between the two desired bands, the second PLL is operating at the missing offset frequency. A double quadrature mixer is used to add or subtract the two frequencies to get either band. A major drawback of this design is that a dual band synthesizer needs two (2) PLLs to get a center frequency and an offset frequency of the two sidebands. Hence the area for implementation, as well as current consumption and noise contributions of two PLLs have to be taken into account, which makes this dual band architecture less attractive.

The concept of using an oscillator which is operating at a certain fraction away from the wanted signal and an additional divider to obtain the offset frequency from the oscillator output is also known:

In HK 1009895. "Wide Band Zero IF Quadrature Demodulator Using a Intermediate Frequency and a Single Local Oscillator", Jaffee James, an oscillator operating at a frequency below the input frequency is used to mix to an intermediate frequency. The full down conversion is done by a frequency obtained by means of an integer N divider. In the specific example they show, the divider divides by four (4) and therefore produces quadrature phases needed for the single side band mixers.

In U.S. Pat. No. 6,782,249 A, "Quadrature Signal Generation in an Integrated Direct Conversion Radio Receiver", Feldmann Arnold, an oscillator operates at ⅔ of the carrier frequency. An additional divider by two (2) is used to obtain the signal at ⅓ of the carrier frequency. These signals are added by means of mixers and filters.

The concepts in HK 1009895 and U.S Pat. No. 6,782,249 A generate only one frequency band, therefore these patents do not cover dual band architectures. In HK 1009895 the division factor is not specified, in U.S. Pat. No. 6,782,249 the factor is two.

A dual band architecture for the 2.5GHz and the 5GHz band using only one oscillator is presented in US 2004/0224644 A1, "Dual Band Transceiver Architecture for Wireless Communication", Szu-Hsien Wu, Cbao-Sbiun Wang, Tzu-Yi Yang. In this publication, a frequency generator with an oscillator operating at 2.5GHz outputs two signals, at 3.75GHz and 1.25GHz, respectively. It is not explained how the frequency multiplication by a factor 1.5 is obtained. However, these two signals, at 3.75GHz and 1.25GHz are then added or subtracted to produce the desired frequency bands. However, since the oscillator is operating at the lower band frequency, the frequency plan is more complicated: First both frequency fractions, i.e., the center frequency at 3.75GHz and the frequency offset at 1.25GHz, have do be derived from the oscillator outputs by (not further described) multiplication circuits. These circuits multiply the oscillator output by a factor 1.5 or 0.5, respectively. Then these two frequencies are used in the standard way for dual band synthesizers, see e.g. reference to Razavi. Since the oscillator operates at the lower band frequency the solution is safe against oscillator pulling.

DISCLOSURE OF THE INVENTION

It is the object of the present invention to provide a dual band oscillator for a phase locked loop, which is simple in construction and which is safe against oscillator pulling.

This object is achieved by providing a dual band oscillator as described in the independent claim.

Other features which are considered to be characteristic for the invention are set forth in the dependent claims, which are incorporated here for reference.

The dual band frequency synthesizer according to the invention generates either a first output frequency $f_{high}$ or a second output frequency $f_{low}$, where $f_{high}=2\,f_{low}$, and comprises an oscillator circuit for generating at its output a frequency $f_{VCO}=(f_{high}+f_{low})/2$, a divide by three (3) circuit, coupled to the output of the oscillator circuit, for generating at its output an offset frequency $f_{DB3}=f_{VCO}/3$, and a double quadrature mixer circuit, coupled to the output of the oscillator circuit and to the output of the divide by three circuit, for generating either the first output frequency $f_{high}=f_{VCO}+f_{DB3}$ or the second output frequency $f_{low}=f_{VCO}-f_{DB3}$.

The frequency of the VCO in this architecture is far away from any other RF frequency (inclusive harmonics) in the System, hence the PLL is very robust with respect to pulling.

The presented concepts uses the same frequency fractions, i.e. $f_{VCO}$ and $f_{DB3}$, as US 2004 0224644 A1, but derives the larger one, $f_{VCO}$, directly from the oscillator and the lower one, $f_{DB3}$, by a simple division by three (3). Hence the frequency generation is much simpler. In the architecture presented, the use of a quadrature divide by three (3) circuit is the essential ingredient: it allows to use the same VCO to get the center frequency and the offset frequency in quadrature phases which can be added and subtracted by means of single sideband mixers (double quadrature mixers). Hence this architecture has the benefits of dual band synthesizers, that avoid VCO pulling and achieve two bands of operation with one synthesizer, while using only one PLL.

In a preferred embodiment of the invention, a quadrature synthesizer is used, comprising a quadrature oscillator having quadrature outputs $I_{VCO}$ and $Q_{VCO}$, a quadrature divider having quadrature outputs $I_{DB3}$ and $Q_{DB3}$, and double quadrature mixers having quadrature outputs $I_{RF}$ and $Q_{RF}$. The double mixer circuit comprises preferably a single side band mixer.

Either one of the two frequencies $f_{high}$ or $f_{low}$ can be selected by an output selector which selects the appropriate side band of the mixer.

A PLL operating at a frequency which is not an integer multiple of the transmitter frequency is the most robust solution with respect to pulling. The approach of a dual band synthesizer has the additional advantage of getting both desired frequency bands as the two sidebands of a double quadrature mixer. Hence the same architecture can be used for both frequencies.

DESCRIPTION OF THE PREFERRED EMBODIMENT OF THE INVENTION

Figure 1:
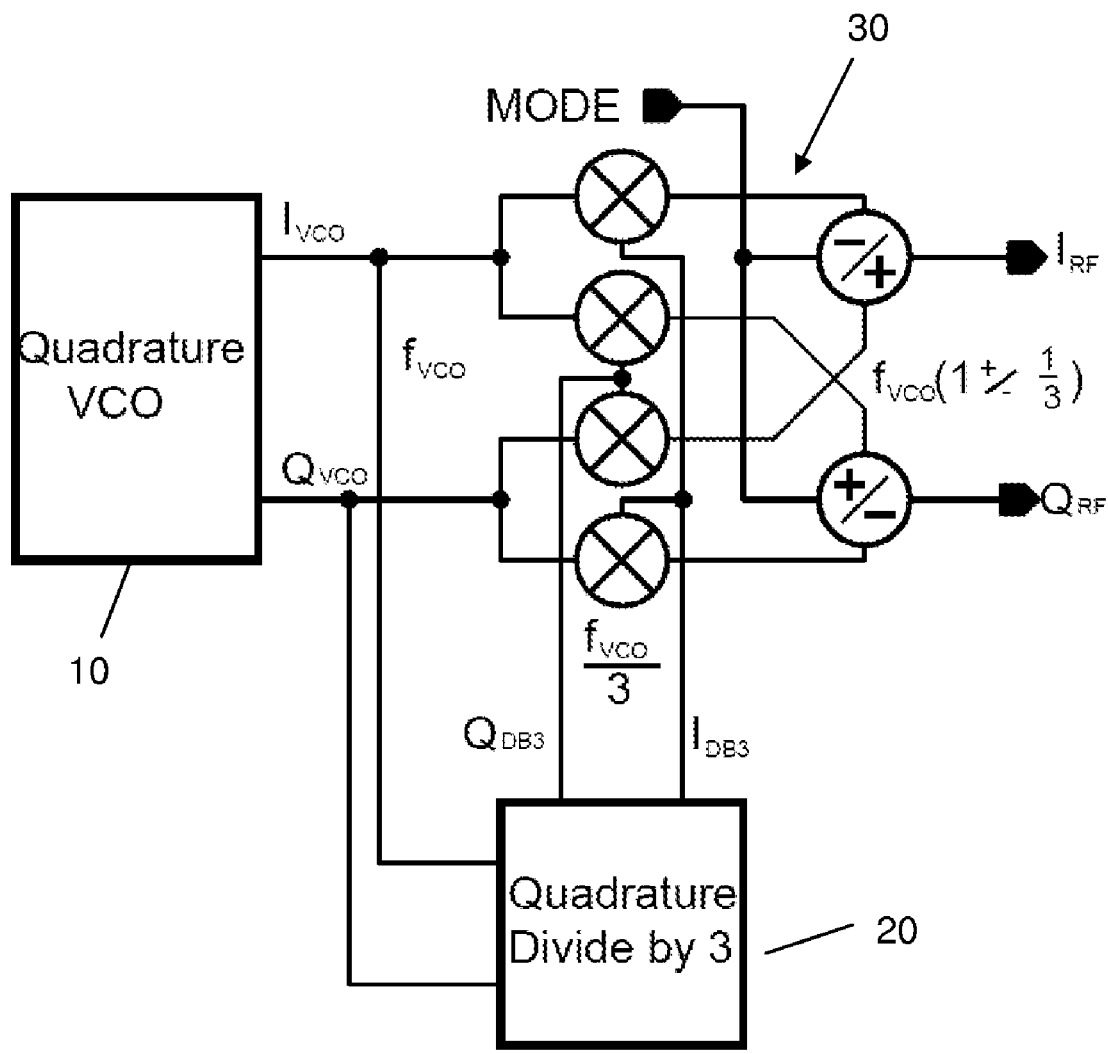
FIG. 1 shows a block diagram of the dual band PLL frequency synthesizer according to an embodiment of the invention for generating output frequencies with a factor of two apart from each other.

The inventive concept relates to a dual band frequency synthesizer architecture to obtain two output frequencies $f_{high}$ and $f_{low}$ which differ by a factor of two, i.e., $f_{high}=2\,f_{low}$.

In order to use the same PLL for both frequency bands, the oscillator circuit (VCO) 10 is designed for outputting the center frequency between the bands, i.e. $f_{VCO}=(f_{high}+f_{low})/2$. This output frequency, $f_{VCO}$, is supplied to a divide by three (3) circuit 20, where it is divided by three, to obtain an offset frequency, $f_{DB3}=f_{VCO}/3$. This offset frequency, $f_{DB3}$, is added to, respectively subtracted from the VCO output frequency, $f_{VCO}$, by means of single side band mixers 30 (double quadrature mixer). Therefore it is necessary to have the oscillator signal $f_{VCO}$ and the divider signal $f_{DB3}$ in four (4) equidistant phases (differential I and Q signal). This can be obtained by using a quadrature VCO and by using a quadrature divide by 3 circuit. The frequency plan is as follows:

The VCO output frequency, $f_{VCO}$, of the VCO 10 is divided by three (3) by the quadrature divider 20, i.e. we get $f_{DB3}=f_{VCO}/3$. The double quadrature mixer 30 can now add or subtract the two frequencies to get $$f_{out} = \left(1 + \frac{1}{3}f_{VCO}\right) = \begin{cases} \frac{4}{3}f_{VCO} =: f_{high} \\ \frac{2}{3}f_{VCO} =: f_{low} \end{cases}$$

The two output frequencies $f_{high}$ and $f_{low}$ differ by a factor of two, i.e., $f_{high}=2\,f_{low}$, and are derived from the same VCO frequency, $f_{VCO}=(f_{high}+f_{low})/2$.

The mixer circuit comprises a "MODE" input with which the output frequency can be selected to be either $f_{high}$ or $f_{low}$.

The invention claimed is:

1. A dual band frequency synthesizer for generating either a first quadrature output frequency $f_{high}$ or a second quadrature output frequency $f_{low}$, where $f_{high}=2\,f_{low}$, comprising:
   a quadrature oscillator circuit for generating at its quadrature outputs $I_{VCO}$ and $Q_{VCO}$ signals with a frequency $f_{VCO}=(f_{high}+f_{low})/2$, wherein $f_{VCO}$ is not a integer multiple of $f_{high}$ and $f_{low}$;
   a quadrature divide by three (3) circuit, coupled to the quadrature outputs $I_{VCO}$ and $Q_{VCO}$ of the oscillator circuit, for generating at its output an offset frequency $f_{DB3}=f_{VCO}/3$; and
   a double quadrature mixer circuit, coupled to the quadrature outputs $I_{VCO}$ and $Q_{VCO}$ of the oscillator circuit and to the quadrature outputs $I_{DB3}$ and $Q_{DB3}$ of the divide by three circuit, for generating at its quadrature outputs $I_{RF}$ and $Q_{RF}$ either the first quadrature output frequency $f_{high}=f_{VCO}+f_{DB3}$ or the second quadrature output the frequency $f_{low}=f_{VCO}-f_{DB3}$.

2. The dual band frequency synthesizer according to claim 1, wherein the double mixer circuit comprises single side band mixers.

3. The dual band frequency synthesizer according to claim 1, including an output selector for selecting either of the frequencies $f_{high}$ or $f_{low}$ by selecting the appropriate side band of the mixer.

4. The dual band frequency synthesizer according to claim 3, wherein the double mixer circuit comprises single side band mixers.

* * * * *